United States Patent
Gotoh et al.

(10) Patent No.: US 6,927,809 B2
(45) Date of Patent: Aug. 9, 2005

(54) ACTIVE MATRIX SUBSTRATE AND DISPLAY DEVICE

(75) Inventors: Masahito Gotoh, Fukuyama (JP); Tohru Ueda, Fukuyama (JP); Yoshinori Higami, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 105 days.

(21) Appl. No.: 10/694,506

(22) Filed: Oct. 27, 2003

(65) Prior Publication Data

US 2004/0257489 A1 Dec. 23, 2004

(30) Foreign Application Priority Data

Oct. 31, 2002 (JP) ........................................ 2002-318514

(51) Int. Cl.[7] .............................................. G02F 1/136
(52) U.S. Cl. ............................. 349/44; 257/59; 257/72
(58) Field of Search .............................. 349/44; 267/59, 267/72

(56) References Cited

U.S. PATENT DOCUMENTS

| | | | | |
|---|---|---|---|---|
| 2004/0004221 A1 | * | 1/2004 | Murade ....................... | 257/72 |
| 2004/0051822 A1 | * | 3/2004 | Sato ........................... | 349/43 |
| 2004/0056297 A1 | * | 3/2004 | Iki et al. .................... | 257/306 |

FOREIGN PATENT DOCUMENTS

JP          2001-066638        3/2001

* cited by examiner

Primary Examiner—Robert H. Kim
Assistant Examiner—Prasad R. Akkapeddi
(74) Attorney, Agent, or Firm—Keating & Bennett, LLP

(57) ABSTRACT

The active matrix substrate of the invention includes: a storage capacitor formed on a board; a first insulating layer formed on the storage capacitor; a semiconductor layer formed above the storage capacitor via the first insulating layer: a gate insulating layer formed on the semiconductor layer; a gate electrode layer including a gate electrode formed above the semiconductor layer via the gate insulating layer; a second insulating layer covering the gate electrode layer and the semiconductor layer; a first light-shielding layer formed above the semiconductor layer via the second insulating layer to cover at least a channel region of the semiconductor layer; a third insulating layer formed on the first light-shielding layer; a source electrode layer including source and drain electrodes formed on the third insulating layer; a fourth insulating layer formed on the source electrode layer; and a pixel electrode formed on the fourth insulating layer and electrically connected to the drain electrode. The first light-shielding layer is conductive and has a drain-side light-shielding portion electrically connected to one of a pair of electrodes of the storage capacitor and also to the drain electrode.

10 Claims, 9 Drawing Sheets

ACTIVE MATRIX SUBSTRATE AND DISPLAY DEVICE

BACKGROUND OF THE INVENTION

The present invention relates to a display device and an active matrix substrate used for the display device.

Among thin, low-power liquid crystal display (LCD) devices, active matrix LCD devices having switching elements for respective pixels exhibit high-contrast display and fast response speed. Having such high performance, the active matrix LCD devices have found applications in various fields including displays of personal computers and the like and portable TVs, and thus recently the market scale thereof has rapidly expanded. Among others, those having thin film transistors (TFTs) as the switching elements (hereinafter, such display devices are occasionally called "TFT type LCD devices") have been widely used.

Note that one of the substrates constituting an active matrix LCD device that includes switching elements is herein called an "active matrix substrate", and in particular, an active matrix substrate including TFTs as the switching elements is called a "TFT substrate". Typically, an active matrix LCD device includes an active matrix substrate, a counter substrate and a liquid crystal layer interposed between these substrates. A voltage is applied across the liquid crystal layer via a pixel electrode formed on the active matrix substrate and a counter electrode (common electrode) formed on the counter substrate, to change the aligned state of the liquid crystal layer. With this change of the aligned state, the polarized state of light passing through the liquid crystal layer is controlled, to thereby provide display. Note that in an in-plane switching (IPS) mode LCD device, the active matrix substrate includes both the pixel electrodes (display signal electrodes) and the counter electrode.

Improvement in light resistance, together with enhancement in luminance (aperture ratio) and definition, are problems to be overcome in technical development of the TFT type LCD devices. The reason is that intense light incident on a semiconductor layer (silicon layer) constituting a TFT will cause generation of leak current, and this will degrade the display quality. In particular, in a projection display device, among the TFT type LCD devices, higher luminance and higher definition of a liquid crystal panel are strongly demanded. In addition, since the liquid crystal panel is irradiated with more intense light than a liquid crystal panel of a direct-view display device, there is a tight request for the light resistance.

Japanese Laid-Open Patent Publication No. 2001-66638 (Literature 1), for example, discloses a TFT type LCD device that succeeded in increasing the pixel aperture ratio and improving the light shielding property for a semiconductor layer of each TFT. In a TFT substrate disclosed in Literature 1, a storage capacitor is formed in a TFT portion (portion of the TFT substrate in which each TFT is formed) at a position underlying the semiconductor layer of each TFT, and electrodes of the storage capacitor are used as a light-shielding layer.

However, the LCD device disclosed in Literature 1 has a problem that while light incident from below the TFT (from the substrate side) can be sufficiently blocked with the electrodes of the storage capacitor, light incident from above the TFT or the sides thereof fails to be sufficiently blocked.

The reason is as follows. Light incident from above and the sides is supposed to be blocked by a source electrode layer (including a source electrode, a source interconnection and a drain electrode) placed above a gate electrode via an interlayer insulating film and an upper light-shielding layer placed above the source electrode layer, as shown in FIG. 1 of Literature 1. The source interconnection may form parasitic capacitance with another conductive layer, and this will adversely affect a display signal (display signal voltage) passing through the source interconnection. In particular, if the source interconnection forms large parasitic capacitance with a gate interconnection, a phenomenon called crosstalk and a ghost occurs in the LCD device, and this may possibly degrade the display quality. For this reason, in adoption of the LCD device described in Literature 1, it is required to sufficiently thicken an interlayer insulating film formed between the source electrode layer and a gate electrode layer. This increases the gap between the source electrode layer and the semiconductor layer and, as a result, allows light to enter the semiconductor layer through the gap Literature 1 also discloses a configuration in which a drawing electrode for connecting one of the electrodes of the storage capacitor formed in the lowermost layer and a drain region of the semiconductor layer is formed from a common conductive layer with the gate electrode. In this configuration, since the drawing electrode must be separated from the gate electrode, light is allowed to enter the semiconductor layer through the gap between the gate electrode and the drawing electrode.

Liquid crystal display devices were used to describe the problems related to the conventional active matrix display devices. However, the problems described above are not limited to liquid crystal display devices, but also arise in other non-self emitting display devices including an electrophoresis display device, for example.

In view of the problems described above, an object of the present invention is providing an active matrix display device having a storage capacitor for each pixel, in which light is effectively blocked from entering a semiconductor layer while reduction in aperture ratio is suppressed, and an active matrix substrate used for the active matrix display device.

SUMMARY OF THE INVENTION

To attain the object described above, the active matrix substrate of the present invention is an active matrix substrate including a plurality of semiconductor elements formed on a board. A semiconductor element portion of the active matrix substrate, in which the plurality of semiconductor elements are formed, includes: a storage capacitor formed on the board; a first insulating layer formed on the storage capacitor; a semiconductor layer formed above the storage capacitor via the first insulating layer: a gate insulating layer formed on the semiconductor layer; a gate electrode layer including a gate electrode formed above the semiconductor layer via the gate insulating layer; a second insulating layer covering the gate electrode layer and the semiconductor layer; a first light-shielding layer formed above the semiconductor layer via the second insulating layer to cover at least a channel region of the semiconductor layer; a third insulating layer formed on the first light-shielding layer; a source electrode layer including a source electrode and a drain electrode formed on the third insulating layer; a fourth insulating layer formed on the source electrode layer; and a pixel electrode formed on the fourth insulating layer and electrically connected to the drain electrode, wherein the first light-shielding layer is conductive and has a drain-side light-shielding portion electrically connected to one of a pair of electrodes of the storage capacitor and also electrically connected to the drain electrode.

In a preferred embodiment, the first light-shielding layer further has a source-side light-shielding portion electrically connected to the source electrode.

In a preferred embodiment, the first light-shielding layer further has a middle light-shielding portion having no electrical connection with the source electrode or the drain electrode, and the middle light-shielding portion is placed above the channel region.

In a preferred embodiment, the middle light-shielding portion is held at a constant voltage.

In a preferred embodiment, the first light-shielding layer further has a source-side light-shielding portion connected to the source electrode, the first and second insulating layers have a contact hole for connecting the first light-shielding layer and the one of the electrodes of the storage capacitor, and the second insulating layer further has a first contact hole for connecting the drain-side light-shielding portion and a second contact hole for connecting the source-side light-shielding portion and the source region of the semiconductor layer, the third insulating layer has a third contact hole for connecting the drain electrode and the drain-side light-shielding portion and a fourth contact hole for connecting the source electrode and the source-side light-shielding portion, and the first contact hole and the third contact hole are placed to be in line with each other, and the second contact hole and the fourth contact hole are placed to be in line with each other.

In a preferred embodiment, the semiconductor layer has LDD regions on both sides of the channel region, and the first light-shielding layer is placed above at least the channel region and the LDD regions.

In a preferred embodiment, the first light-shielding layer further has a middle light-shielding portion having no electrical connection with the source electrode or the drain electrode, and the middle light-shielding portion is placed above the channel region and the LDD regions.

In a preferred embodiment, the middle light-shielding portion is held at a constant potential.

In a preferred embodiment, the active matrix substrate further includes, between the source electrode layer and the fourth insulating layer, a fifth insulating layer covering the source electrode layer, and a second light-shielding layer formed above at least a gap between the source electrode and the drain electrode via the fifth insulating layer.

The display device of the present invention includes any of the active matrix substrates described above and a display medium layer. The display device of the present invention is a non-self emitting display device having a liquid crystal layer, an electrophoresis layer or the like as the display medium layer.

DETAILED DESCRIPTION OF THE INVENTION

Figure 1:
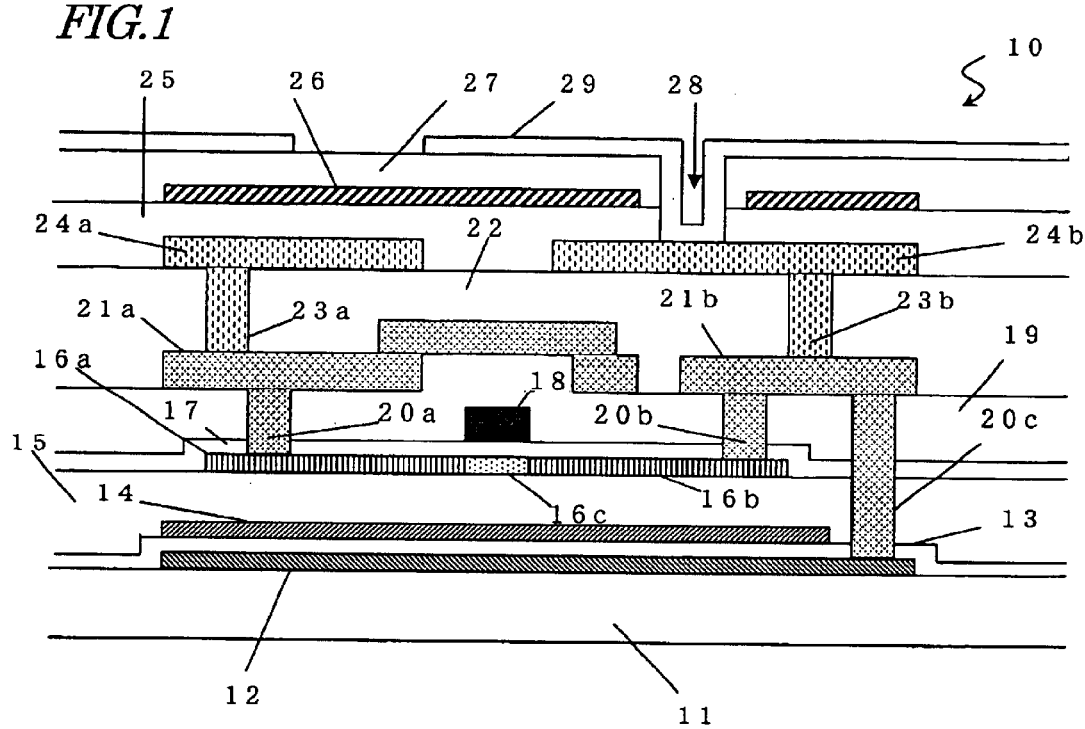
FIG. 1 is a diagrammatic cross-sectional view of the structure of a TFT portion 10 of a TFT substrate of Embodiment 1 according to the present invention.

Hereinafter, a structure of a display device according to the present invention, in particular, a structure of an active matrix substrate of the display device and a fabrication method thereof will be described.

Herein, to describe embodiments of the present invention, a typical active matrix liquid crystal display (LCD) device, having pixel electrodes formed on an active matrix substrate and a counter electrode opposed to the pixel electrodes via a liquid crystal layer, is used as the display device. Note however that the present invention is also broadly applicable to LCD devices having other electrode placements such as the IPS mode and other non-self emitting display devices including an electrophoresis display device.

An LCD device of an embodiment of the present invention includes a TFT substrate (active matrix substrate) having TFTs (semiconductor elements) for respective pixel electrodes, a liquid crystal layer (display medium layer) and a counter substrate having a counter electrode opposed to the pixel electrodes via the liquid crystal layer. For the part of the LCD device other than the TFT substrate, any known configurations can be widely adopted. Hereinafter, therefore, only the configuration of the TFT substrate and its fabrication method will be described.

The TFT substrate of the embodiment of the present invention includes a storage capacitor formed on a board (transparent board such as glass board, for example). A semiconductor layer of each TFT is formed above the storage capacitor via a first insulating layer. A pair of electrodes of the storage capacitor, opposed to each other via a dielectric layer constituting the storage capacitor, function as a lower light-shielding layer blocking light from entering the semiconductor layer of the TFT from below. By use of the electrodes of the storage capacitor as the lower light-shielding layer, a high pixel aperture ratio is attained as in the conventional active matrix substrate described above.

The TFT substrate of the embodiment also includes a gate insulating layer formed on the semiconductor layer, a gate electrode layer including a gate electrode (a single conductive layer also including a gate interconnection) formed above the semiconductor layer via the gate insulating layer, a second insulating layer covering the gate electrode layer and the semiconductor layer, and a first light-shielding layer formed above the semiconductor layer via the second insulating layer to cover at least a channel region of the semiconductor layer. The TFT substrate further includes a third insulating layer formed on the first light-shielding layer, a source electrode layer including a source electrode and a drain electrode (a single conductive layer also including a source interconnection) formed on the third insulating layer, a fourth insulating layer formed on the source electrode layer, and a pixel electrode formed on the fourth insulating layer and electrically connected to the drain electrode.

The first light-shielding layer is conductive and has a drain-side light-shielding portion electrically connected to one of the pair of electrodes constituting the storage capacitor and also electrically connected to the drain electrode. In other words, the first light-shielding layer, placed between the gate electrode layer and the source electrode layer, shields at least the channel region of the semiconductor layer from light, and yet is electrically connected to the drain region of the semiconductor layer in its drain-side light-shielding portion. The drain-side light-shielding portion may be directly connected to (in direct contact with) the drain region, or may be electrically connected to the drain region via the pixel electrode.

Since the first light-shielding layer is a separate layer from the gate electrode layer, it can be formed into a shape surrounding the gate electrode, and therefore light can be effectively blocked from entering the channel region of the semiconductor layer from above. In addition, the first light-shielding layer intervenes in electrical connection between the drain region of the semiconductor layer and the electrode of the storage capacitor and electrical connection between the drain region and the drain electrode. By this intervention, contact holes for these electrical connections can be comparatively shallow. This advantageously suppresses occurrence of a break in a contact hole portion (disconnection of a conductive layer at a step).

Since the first light-shielding layer is a separate layer from the source electrode layer, parasitic capacitance between the first light-shielding layer and the gate interconnection does not so much affect the display quality as parasitic capacitance between the source interconnection and the gate interconnection does. Also, such parasitic capacitance only affects the pixel concerned individually. Therefore, the interlayer insulating film formed between the first light-shielding layer and the gate electrode layer can be made thinner than the interlayer insulating film formed between the source electrode layer and the gate electrode layer described in Literature 1. This means that the first light-shielding layer can be placed closer to the semiconductor layer than in the conventional case and, as a result, light can be more effectively blocked from entering the semiconductor layer (channel region, in particular).

The first light-shielding layer may also have a source-side light-shielding portion electrically connected to the source electrode. The first light-shielding layer may further have a middle light-shielding portion having no electrical connection with the source electrode or the drain electrode. The middle light-shielding portion, if provided, may be placed above the channel region. Such a middle light-shielding portion, which is electrically independent of the source electrode and the drain electrode, can be held at a constant potential.

When the semiconductor layer has LDD regions on both sides of the channel region, the first light-shielding layer is preferably placed above at least the channel region and the LDD regions. In this case, also, the first light-shielding layer may have the source-side light-shielding portion and the middle light-shielding portion in addition to the drain-side light-shielding portion as described above.

A display panel having the active matrix substrate of the embodiment of the present invention, which can provide a high aperture ratio and an excellent light-shielding property, is suitably used for a display device of which the display panel is irradiated with intense light, such as a projection display device.

(Embodiment 1)

The structure and fabrication method of a TFT portion of a TFT substrate of Embodiment 1 of the present invention will be described with reference to FIGS. 1, 2A to 2D and 3A to 3D. A known structure may be adopted for the other part of the TFT substrate, of which description is therefore omitted here.

FIG. 1 is a diagrammatic cross-sectional view of the structure of a TFT portion 10 of the TFT substrate. FIGS. 2A to 2D and FIGS. 3A to 3D are cross-sectional views and plan views, respectively, demonstrating a fabrication process of the TFT portion 10. The cross-sectional views of FIGS. 1 and 2A to 2D are views taken along line A–A' in FIGS. 3A to 3D.

As shown in FIG. 1, the TFT portion 10 includes a first storage capacitor electrode 12, a storage capacitor dielectric layer 13 and a second storage capacitor electrode 14 formed on a transparent board (glass board, for example) 11. The overlap region of these components constitutes a storage capacitor.

A first insulating layer 15 is formed covering the storage capacitor, and a semiconductor layer 16 is formed on the first insulating layer 15. The semiconductor layer 16 has a source region 16a, a drain region 16b and a channel region 16c formed between the source and drain regions. A gate insulating layer 17 is formed covering the semiconductor layer 16, and a gate electrode 18 is formed above the channel region 16c via the gate insulating layer 17. The gate electrode 18 is formed from a common conductive layer (gate electrode layer) with a gate interconnection (scanning line, not shown).

A second insulating layer 19 is formed covering the gate electrode layer including the gate electrode 18, and a first light-shielding layer is formed on the second insulating layer 19. The light-shielding layer shown in FIG. 1 has two separate parts, a source-side light-shielding portion 21a and a drain-side light-shielding portion 21b. The source-side light-shielding portion 21a covers an area of the semiconductor layer 16 including the channel region 16c.

The source-side light-shielding portion 21a is connected to the source region 16a of the semiconductor layer 16 via a first source contact hole 20a formed through the second insulating layer 19 and the gate insulating layer 17. The drain-side light-shielding portion 21b is connected to the drain region 16b of the semiconductor layer 16 via a first drain contact hole 20b formed through the second insulating layer 19 and the gate insulating layer 17. The drain-side light-shielding portion 21b is also connected to the first storage capacitor electrode 12 via a storage capacitor contact hole 20c formed through the second insulating layer 19, the gate insulating layer 17 and the first insulating layer 15. The contact holes 20a and 20b also function to block light from entering the channel region 16c from the sides.

A third insulating layer 22 is formed covering the first light-shielding layer, and a source electrode 24a and a drain electrode 24b are formed on the third insulating layer 22. The source electrode 24a and the drain electrode 24b are formed from a common conductive layer (source electrode layer) with a source interconnection (signal line, not shown). The source electrode 24a is connected to the source-side light-shielding portion 21a via a second source contact hole 23a formed through the third insulating layer 22. The drain electrode 24b is connected to the drain-side light-shielding portion 21b via a second drain contact hole 23b formed through the third insulating layer 22.

A fourth insulating layer 27 is formed on the source electrode 24a and the drain electrode 24b, and a pixel electrode 29 is formed on the fourth insulating layer 27. The pixel electrode 29 is connected to the drain electrode 24b via a pixel electrode contact hole 28 formed through the fourth insulating layer 27. The pixel electrode 29 is typically formed from a transparent conductive layer.

The illustrated embodiment further includes a fifth insulating layer 25 and a second light-shielding layer (upper light-shielding layer) 26 between the source electrode layer including the source electrode 24a and the drain electrode 24b and the fourth insulating layer 27. The fifth insulating layer 25 is formed covering the source electrode layer, and the second light-shielding layer 26 is formed above at least a gap between the source electrode 24a and the drain electrode 24b via the fifth insulating layer 25. By providing the second light-shielding layer 26, the amount of light incident on the channel region 16c of the semiconductor layer 16 can be reduced.

Hereinafter, a fabrication method of the TFT substrate having the TFT portion 10 will be described with reference to FIGS. 2A to 2D and 3A to 3D.

Figure 2A:
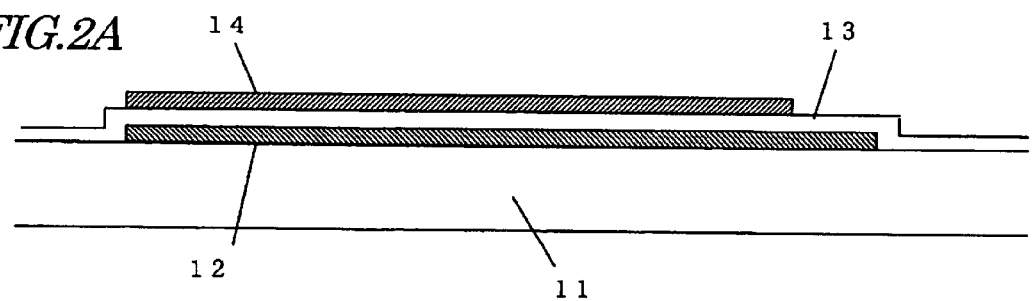
FIGS. 2A to 2D are cross-sectional views demonstrating a fabrication process of the TFT portion 10 of the TFT substrate of Embodiment 1.

First, as shown in FIG. 2A, a polysilicon film containing phosphorus (P) element in high concentration is deposited on the transparent board 11 to a thickness of 100 nm by CVD, and patterned into a predetermined shape by a general photolithographic process and dry etching process to obtain the first storage capacitor electrode 12.

A silicon oxide film having a thickness of 10 nm to 100 nm is formed over roughly the entire surfaces of the transparent board 11 and the first storage capacitor electrode 12. The silicon oxide film is used as the storage capacitor dielectric layer 13. The capacitance of the storage capacitor will be greater as the dielectric layer 13 is thinner. However, an excessively thin dielectric layer 13 may increase leak current and cause dielectric breakdown with high possibility. In this embodiment, therefore, the thickness of the storage capacitor dielectric layer 13 is set at 50 nm considering both the capacitance of the storage capacitor and the leak current. The resultant substrate is then annealed at a temperature of 900° C. or more to improve the quality of the storage capacitor dielectric layer 13. In this annealing, oxygen or chlorine gas is included in the annealing atmosphere. Since the first storage capacitor electrode 12 is formed of a film containing Si as a main component, thermal oxidation occurs with such gas simultaneously with the annealing. This enables formation of a high-quality storage capacitor dielectric layer 13 with reduced leak current.

A polysilicon film containing P element in high concentration having a thickness of 50 nm and then a tungsten silicide film having a thickness of 100 nm are formed sequentially on roughly the entire surface of the storage capacitor dielectric layer 13. The tungsten silicide film and the polysilicon film are then patterned into a predetermined shape by a general photolithographic process and dry etching process to obtain the second storage capacitor electrode 14. The second storage capacitor electrode 14, having the layer containing metal tungsten, also functions as a lower light-shielding layer for the TFT. Also, to provide a function as a storage capacitor interconnection, the second storage capacitor electrode 14 may be formed into a wiring pattern or a lattice shape, to enable direct application of external potential.

The first and second storage capacitor electrodes 12 and 14 and the storage capacitor dielectric layer 13 constitute the storage capacitor of the pixel concerned. The second storage capacitor electrode 14 may be formed of a light-shielding metal film other than the tungsten silicide/polysilicon film.

Figure 2B:
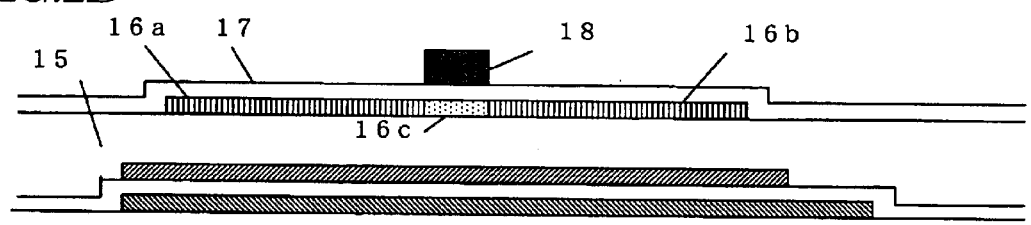
Figure 3A:
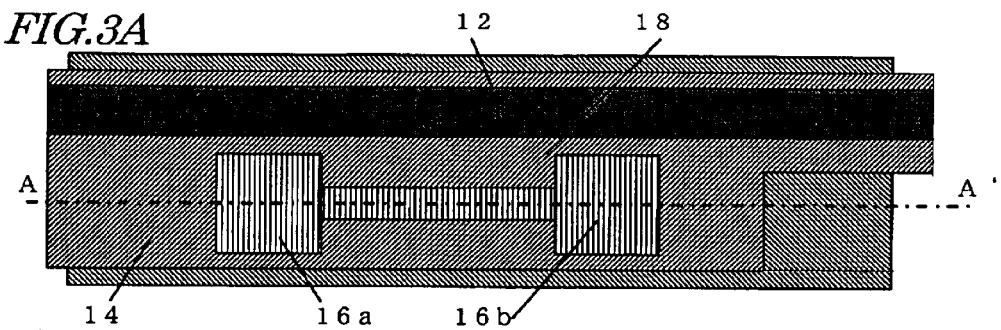
FIGS. 3A to 3D are plan views demonstrating the fabrication process of the TFT portion 10 of the TFT substrate of Embodiment 1.

As shown in FIGS. 2B and 3A, a silicon oxide film is formed to a thickness of about 300 nm by CVD as the first insulating layer 15, and sequentially an amorphous silicon film is formed to a thickness of about 50 nm. The amorphous silicon film is crystallized to form the crystalline silicon layer (semiconductor layer) 16. The crystallization may be made by heating the amorphous silicon at a temperature of 600° C. or more or irradiating the amorphous silicon with excimer laser light, for example. The first insulating layer 15 may not necessarily be formed of the silicon oxide film, but may be formed of a silicon nitride film, a silicon oxide nitride film or a composite film thereof.

The crystalline silicon layer 16 is patterned into a predetermined shape by photolithography and dry etching, and then a silicon oxide film is formed to a thickness of about 80 nm as the gate insulating layer 17. A polysilicon film containing P element in high concentration is then deposited on the gate insulating layer 17 to a thickness of 400 nm, and patterned into a predetermined shape by photolithography and dry etching to obtain the gate electrode 18. A gate interconnection is also formed in this process step simultaneously.

The crystalline silicon layer 16 should be patterned so that at least a portion thereof to be used as the channel region 16c coincide with any of the first and second storage capacitor electrodes 12 and 14 as viewed from right above. This is because the first or second storage capacitor electrode 12 or 14 is used as the lower light-shielding layer for the TFT.

Using the gate electrode 18 as the mask, phosphorus ions are implanted in the crystalline silicon layer 16 in an amount of about $2 \times 10^{15}$ atoms/cm$^2$, to form the source region 16a and the drain region 16b. The portion left unimplanted constitutes the channel region 16c.

Figure 2C:
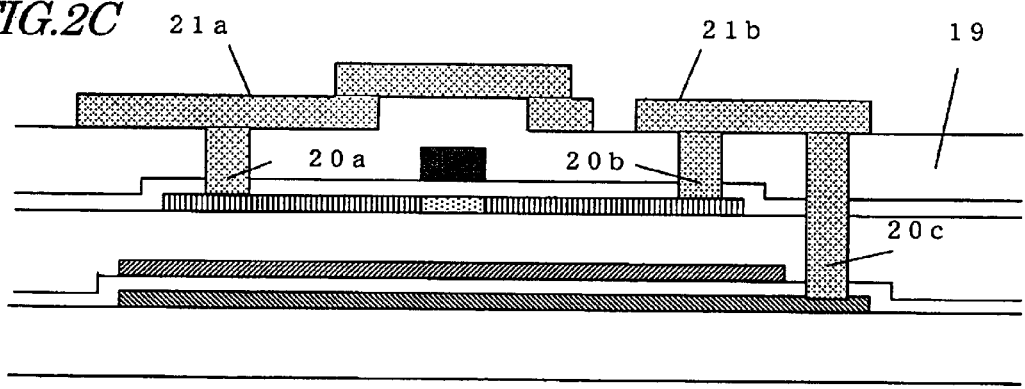
Figure 3B:
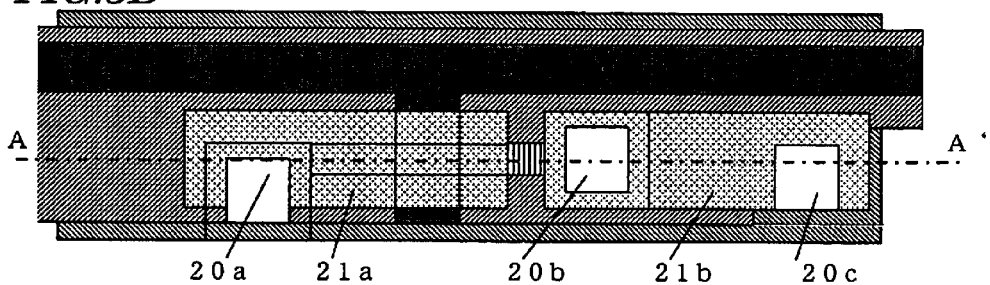

As shown in FIGS. 2C and 3B, a silicon oxide film is formed on the gate electrode 18 and the gate insulating layer 17 to a thickness of 200 nm as the second insulating layer 19. The first source contact hole 20a and the first drain contact hole 20b are then formed simultaneously through the second insulating layer 19 by a general photolithographic process and etching process, exposing the source region 16a and the drain region 16b in the holes, respectively. Also, the storage capacitor contact hole 20c is formed to reach the first storage capacitor electrode 12.

A polysilicon film containing P element in high concentration having a thickness of 100 nm and then a tungsten silicide film having a thickness of 100 nm are formed sequentially on roughly the entire surface of the resultant substrate, and patterned into a predetermined shape by a general photolithographic process and dry etching process, to obtain the source-side light-shielding portion 21a connected to the source region 16a via the first source contact hole 20a and the drain-side light-shielding portion 21b connected to the drain region 16b via the first drain contact hole 20b. The source-side light-shielding portion 21a is formed to cover at least the channel region 16c.

By forming as described above, the light-shielding layer can be placed near the channel region 16c. This improves the light shielding property against light entering the channel region 16c from the sides, which is conventionally insufficient, and thus improves the display quality.

Moreover, the drain-side light-shielding portion 21b, connected to the drain region 16b, is also connected to the first storage capacitor electrode 12 via the storage capacitor contact hole 20c. Therefore, the connection with the drain region 16b of the TFT can be attained without the necessity of providing a too deep contact hole for connection with the storage capacitor placed below the TFT. Thus, a sufficient margin can be given for possible inprocess failure due to overetching during dry etching, such as penetration and contact cut at a step. This contributes to improvement of the productivity and yield of the TFT substrates.

Figure 2D:
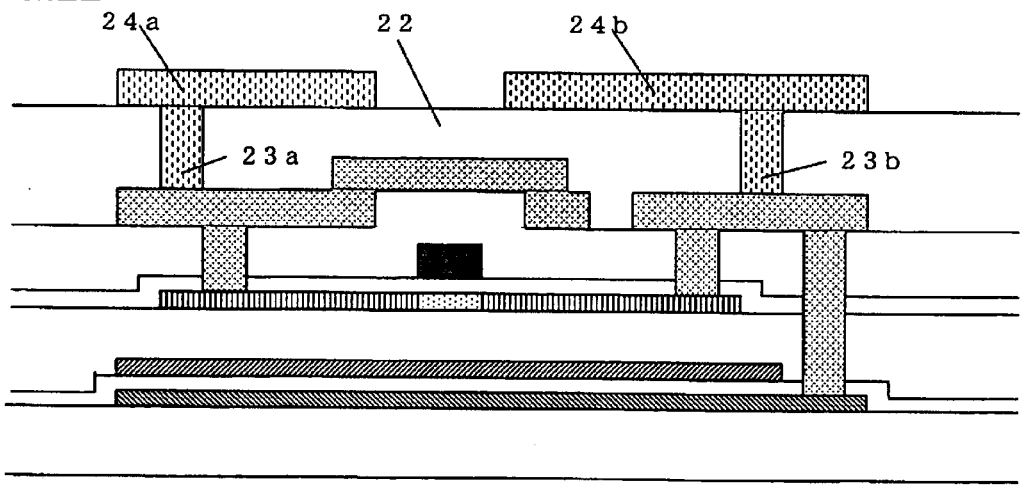
Figure 3C:
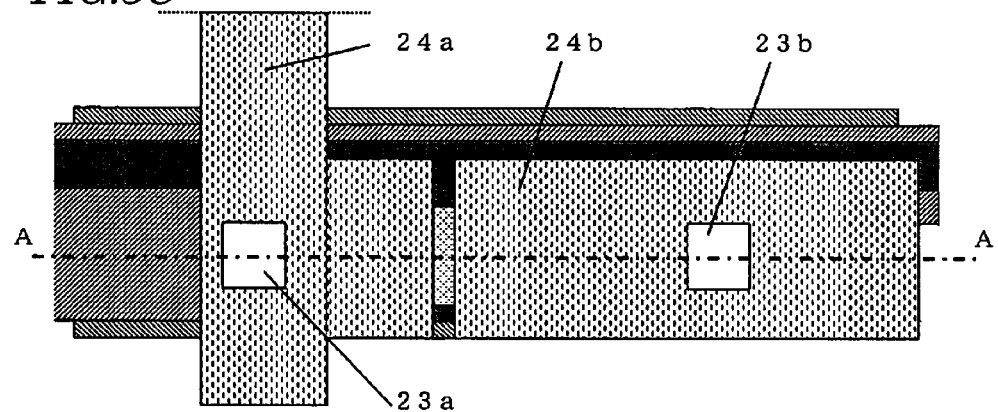

Thereafter, as shown in FIGS. 2D and 3C, a silicon oxide film is formed on roughly the entire surface of the resultant substrate to a thickness of 500 nm by CVD as the third insulating layer 22. The resultant substrate is then heat-treated at 950° C. in a nitrogen atmosphere for 30 minutes to activate the phosphorus ions implanted in the source region 16a and the drain region 16b. The second source contact hole 23a and the second drain contact hole 23b are then formed simultaneously through the third insulating layer 22 by a general photolithographic process, wet etching process and dry etching process, to reach the source-side light-shielding portion 21a and the drain-side light-shielding portion 21b, respectively. The third insulating layer 22 may not necessarily be formed of the silicon oxide film, but may be formed of a silicon nitride film, a silicon oxide nitride film or a composite film thereof.

A multilayer conductive film composed of TiW (100 nm)/AlSi (400 nm)/TiW (100 nm) is then deposited and patterned by a general photolithographic process and dry etching process to form the source electrode 24a and the drain electrode 24b. The source electrode 24a is connected to the source-side light-shielding portion 21a, and then the source region 16a, via the second source contact hole 23a. The drain electrode 24b is connected to the drain-side light-shielding portion 21b, and then the drain region 16b and also the first storage capacitor electrode 12, via the second drain contact hole 23b.

Thereafter, as shown in FIG. 1, a silicon oxide film is formed to a thickness of about 300 nm as the fifth insulating layer 25. A TiW film is then formed to a thickness of 120 nm and patterned by a general photolithographic process and dry etching process, to form the upper light-shielding layer 26 provided for blocking light from entering the TFT from above. The fifth insulating layer 25 may not necessarily be formed of the silicon oxide film, but may be formed of a silicon nitride film, a silicon oxide nitride film or a composite film thereof.

Figure 3D:
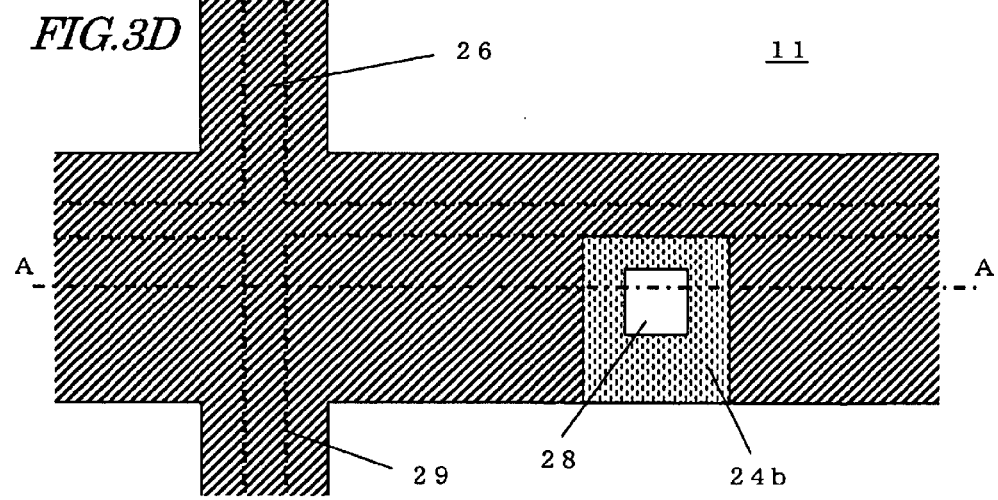

A silicon oxide film is then formed to a thickness of about 300 nm as the fourth insulating layer 27. Thereafter, as shown in FIGS. 1 and 3D, the pixel electrode contact hole 28 is formed through the fourth insulating layer 27 by a general photolithographic process, wet etching process and dry etching process to reach the drain electrode 24b. Finally, an ITO film is formed to a thickness of 100 nm and patterned by a general photolithographic process, wet etching process and dry etching process to form the pixel electrode 29. The pixel electrode 29 is connected to the drain electrode 24b, and thus electrically connected to the first storage capacitor electrode 12. The fourth insulating layer 27 may not necessarily be formed of the silicon oxide film, but may be formed of a silicon nitride film, a silicon oxide nitride film or a composite film thereof.

By following the process described above, the TFT substrate having the TFT portion shown in FIG. 1 is fabricated. Known materials and film formation methods may be adopted as the materials, thicknesses and formation methods of the components of the TFT portion. The sizes such as the film thicknesses may be appropriately changed depending on the use and the like of the TFT substrate.

Alterations to the TFT substrate of Embodiment 1 will be described with reference to FIGS. 4 to 7. In these drawings, substantially the same components as those in FIGS. 1, 2A to 2D and 3A to 3D are denoted by the same reference numerals, and the description thereof is omitted.

Figure 4:
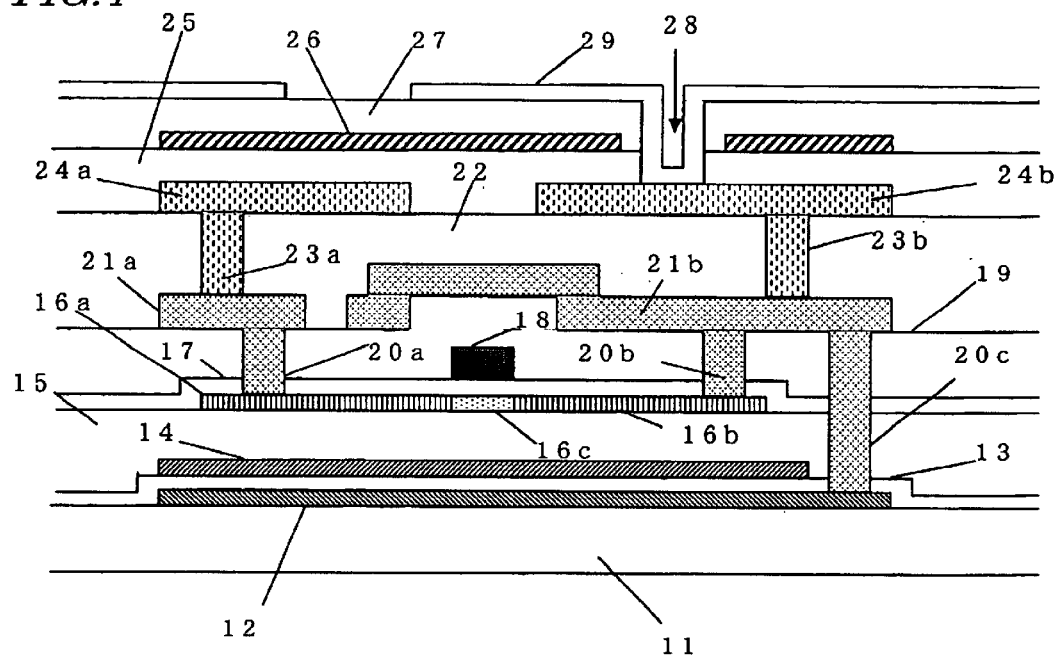
FIG. 4 is a diagrammatic cross-sectional view of the structure of a TFT portion of an alteration to the TFT substrate of Embodiment 1 according to the present invention.

FIG. 4 diagrammatically shows a cross-sectional structure of a TFT portion of an alteration to the TFT substrate of Embodiment 1. This TFT portion is different from the TFT portion shown in FIG. 1 in that the drain-side light-shielding portion 21b of the first light-shielding layer is formed to cover the channel region 16c.

Figure 5:
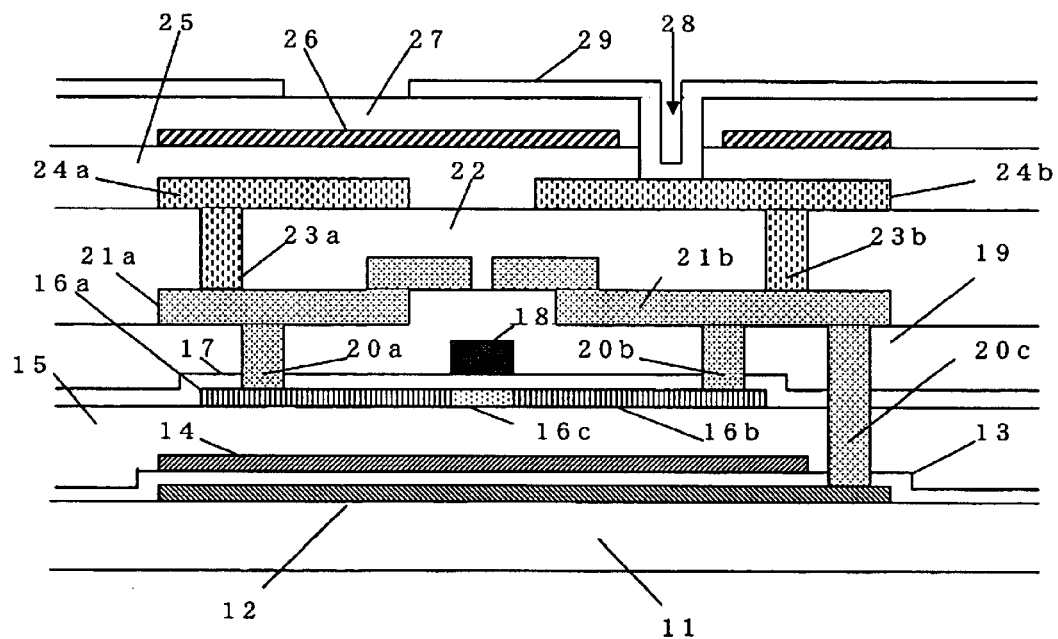
FIG. 5 is a diagrammatic cross-sectional view of the structure of a TFT portion of another alteration to the TFT substrate of Embodiment 1 according to the present invention.

FIG. 5 diagrammatically shows a cross-sectional structure of a TFT portion of another alteration to the TFT substrate of Embodiment 1. This TFT portion is different from the TFT portion shown in FIG. 1 in that the source-side light-shielding portion 21a and the drain-side light-shielding portion 21b of the first light-shielding layer are separated from each other at a position above the gate electrode 18.

Each of the source-side light-shielding portion 21a and the drain-side light-shielding portion 21b partially covers the channel region 16a. Light passing through the gap between the source-side and drain-side light-shielding portions 21a and 21b will not be incident on the channel region 16c because the gap is located above the gate electrode 18.

Figure 6:
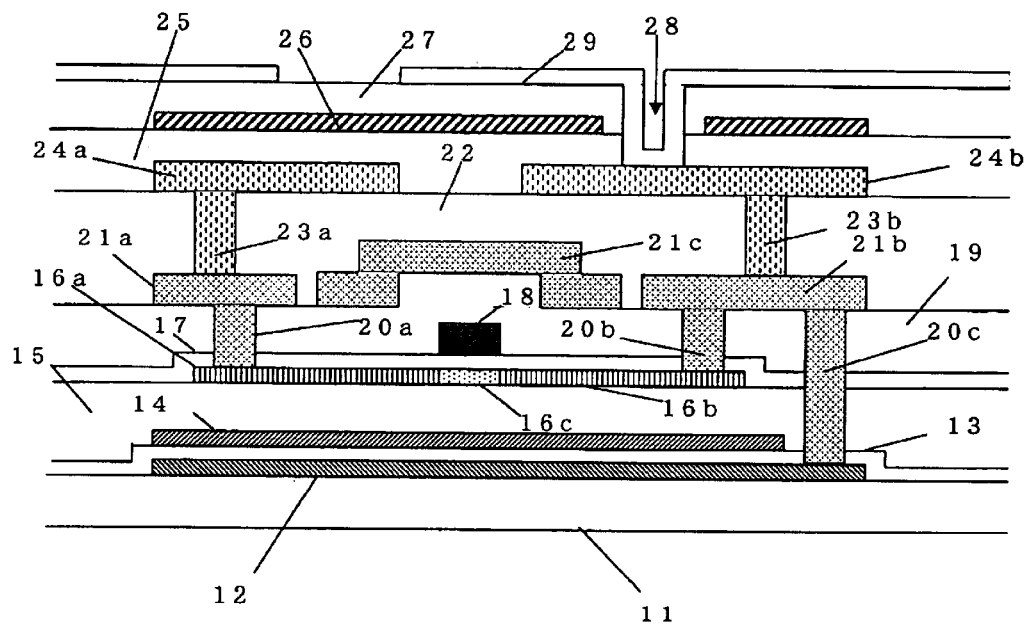
FIG. 6 is a diagrammatic cross-sectional view of the structure of a TFT portion of yet another alteration to the TFT substrate of Embodiment 1 according to the present invention.

FIG. 6 diagrammatically shows a cross-sectional structure of a TFT portion of yet another alteration to the TFT substrate of Embodiment 1. The first light-shielding layer further has a middle light-shielding portion 21c with no electrical connection with the source-side light-shielding portion 21a or the drain-side light-shielding portion 21b, placed to cover the channel region 16c. Since the middle light-shielding portion 21c is electrically independent of the source electrode 24a and the drain electrode 24b, a constant voltage may be applied to this portion from outside the pixel region, for example. By holding the middle light-shielding portion 21c, which is formed above the channel region 16c (gate electrode 18), at a constant voltage, the voltage (potential) at the semiconductor layer (polysilicon layer) can be stabilized. This advantageously stabilizes the TFT characteristics.

Figure 7:
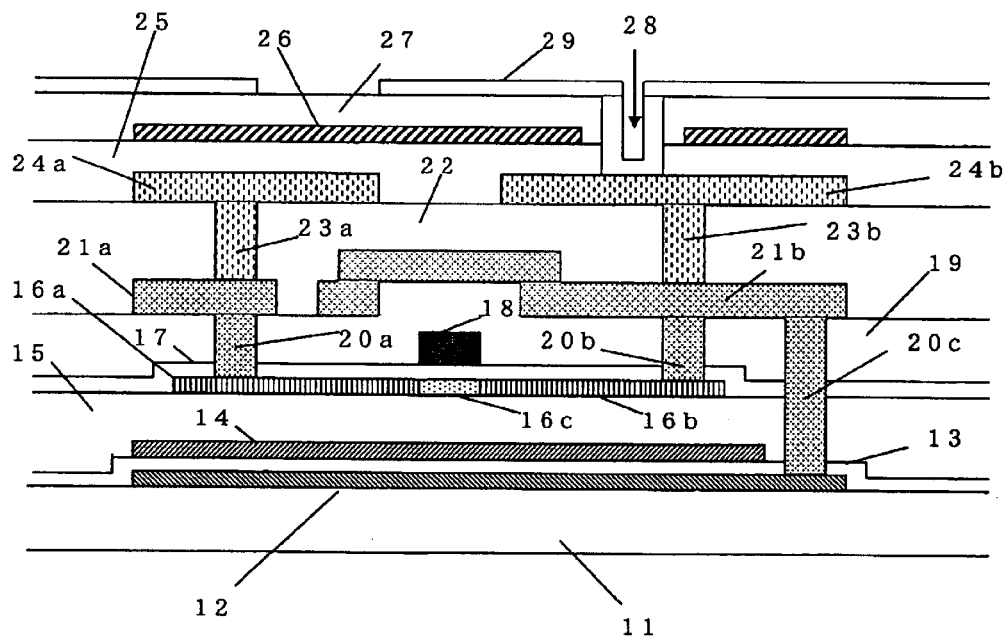
FIG. 7 is a diagrammatic cross-sectional view of the structure of a TFT portion of yet another alteration to the TFT substrate of Embodiment 1 according to the present invention.

FIG. 7 diagrammatically shows a cross-sectional structure of a TFT portion of yet another alteration to the TFT substrate of Embodiment 1. In this TFT portion, the second source contact hole 23a and the second drain contact hole 23b are formed at positions in line with the first source contact hole 20a and the first drain contact hole 20b, respectively. That is, these holes are formed to coincide with each other when viewed in the direction normal to the substrate.

By placing the contact holes as described above, the regions necessary for formation of the contact holes can be reduced, and thus the pixel aperture ratio can be enhanced.

Although the above placement of the contact holes in line with each other was applied to the configuration shown in FIG. 7, the same effect will be obtained when this placement is applied to any of the configurations shown in FIG. 4 to 6.

(Embodiment 2)

The structure and fabrication method of a TFT portion of a TFT substrate of Embodiment 2 of the present invention will be described with reference to FIGS. 8 and 9A to 9D.

The TFT portion in Embodiment 2 is different from the TFT portion in Embodiment 1 shown in FIG. 1 in that the semiconductor layer includes LDD regions 36d formed on both sides of the channel region 36c, in addition to the source region 36a, the drain region 36b and the channel region 36c. The other part of the TFT portion is substantially the same as that in Embodiment 1. In this embodiment, therefore, plan views as those of FIGS. 3A to 3D are not presented. The fabrication method of the TFT substrate of Embodiment 2 is substantially the same as that of Embodiment 1 except for the process step of forming the LDD regions 36d in the semiconductor layer (FIG. 9B). FIGS. 9A to 9D respectively correspond to FIGS. 2A to 2D. Hereinafter, description will be made focusing on the difference in the semiconductor layer, avoiding duplication of description.

Figure 8:
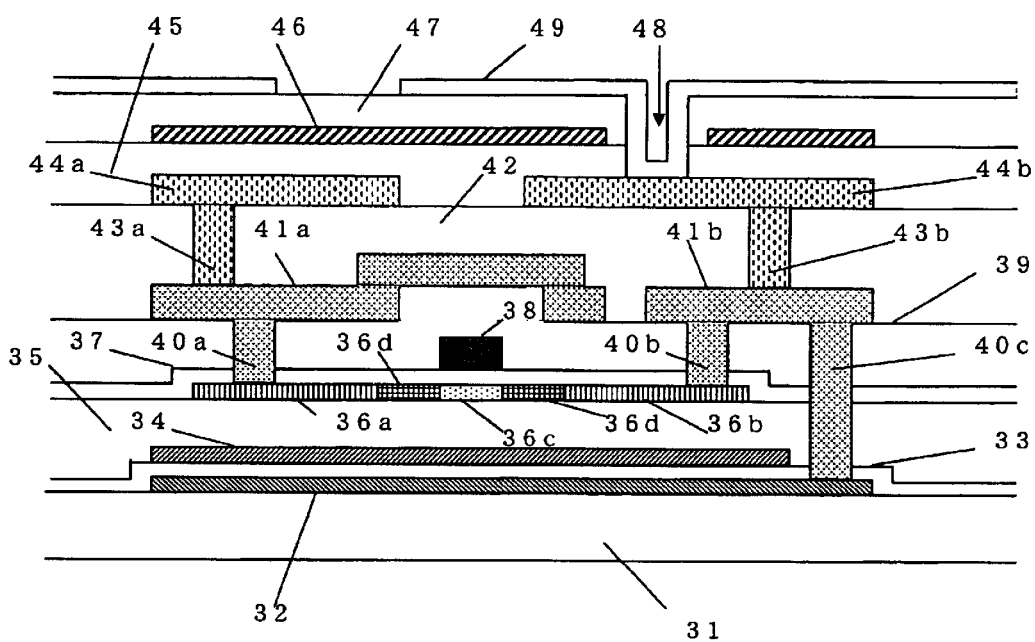
FIG. 8 is a diagrammatic cross-sectional view of the structure of a TFT portion of a TFT substrate of Embodiment 2 according to the present invention.

The TFT portion shown in FIG. 8 includes a first storage capacitor electrode 32, a storage capacitor dielectric layer 33 and a second storage capacitor electrode 34 formed on a transparent board (glass board, for example) 31. The overlap region of these components constitutes a storage capacitor.

A first insulating layer 35 is formed covering the storage capacitor, and a semiconductor layer 36 of a TFT is formed on the first insulating layer 35. The semiconductor layer 36 has a source region 36a, a drain region 36b and a channel region 36c formed between the source and drain regions. The semiconductor layer 36 further has LDD regions 36d between the channel region 36c and the source region 36a and between the channel region 36c and the drain region 36b.

A gate insulating layer 37 is formed covering the semiconductor layer 36, and a gate electrode 38 is formed above the channel region 36c via the gate insulating layer 37. The gate electrode 38 is formed from a common conductive layer (gate electrode layer) with a gate interconnection (scanning line, not shown).

A second insulating layer 39 is formed covering the gate electrode layer including the gate electrode 38, and a first light-shielding layer is formed on the second insulating layer 39. The light-shielding layer has two separate parts, a source-side light-shielding portion 41a and a drain-side light-shielding portion 41b. The source-side light-shielding portion 41a covers the area of the semiconductor layer 36 including the channel region 36c and the LDD regions 36d formed on both sides of the channel region 36c.

The source-side light-shielding portion 41a is connected to the source region 36a of the semiconductor layer 36 via a first source contact hole 40a formed through the second insulating layer 39 and the gate insulating layer 37. The drain-side light-shielding portion 41b is connected to the drain region 36b of the semiconductor layer 36 via a first drain contact hole 40b formed through the second insulating layer 39 and the gate insulating layer 37. The drain-side light-shielding portion 41b is also connected to the first storage capacitor electrode 32 via a storage capacitor contact hole 40c formed through the second insulating layer 39, the gate insulating layer 37 and the first insulating layer 35. The contact holes 40a and 40b also function to block light from entering the channel region 36c from the sides.

A third insulating layer 42 is formed covering the first light-shielding layer, and a source electrode 44a and a drain electrode 44b are formed on the third insulating layer 42. The source electrode 44a and the drain electrode 44b are formed from a common conductive layer (source electrode layer) with a source interconnection (signal line, not shown). The source electrode 44a is connected to the source-side light-shielding portion 41a via a second source contact hole 43a formed through the third insulating layer 42. The drain electrode 44b is connected to the drain-side light-shielding portion 41b via a second drain contact hole 43b formed through the third insulating layer 42.

A fourth insulating layer 47 is formed on the source electrode 44a and the drain electrode 44b, and a pixel electrode 49 is formed on the fourth insulating layer 47. The pixel electrode 49 is connected to the drain electrode 44b via a pixel electrode contact hole 48 formed through the fourth insulating layer 47. The pixel electrode 49 is typically formed from a transparent conductive layer.

The illustrated embodiment further includes a fifth insulating layer 45 and a second light-shielding layer (upper light shielding layer) 46 between the source electrode layer including the source electrode 44a and the drain electrode 44b and the fourth insulating layer 47. The fifth insulating layer 45 is formed covering the source electrode layer, and the second light-shielding layer 46 is formed above at least the gap between the source electrode 44a and the drain electrode 44b via the fifth insulating layer 45. By providing the second light-shielding layer 46, the amount of light incident on the channel region 46c and the LDD regions 46d of the semiconductor layer 46 can be reduced.

The TFT portion can be fabricated by a method similar to that for the TFT portion 10 in Embodiment 1, as is diagrammatically shown in FIGS. 9A to 9D.

Figure 9A:
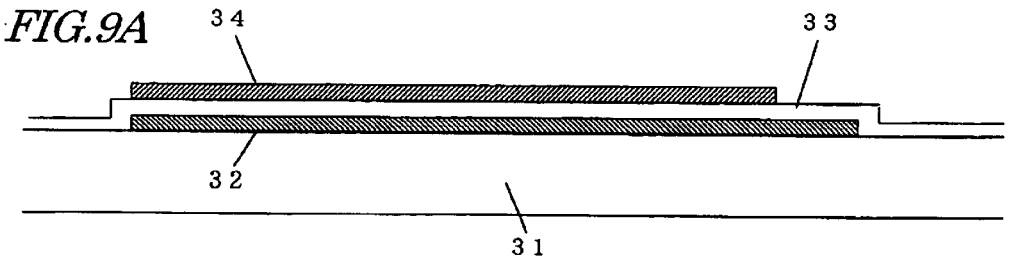
FIGS. 9A to 9D are cross-sectional views demonstrating a fabrication process of the TFT portion of the TFT substrate of Embodiment 2.
Figure 9B:
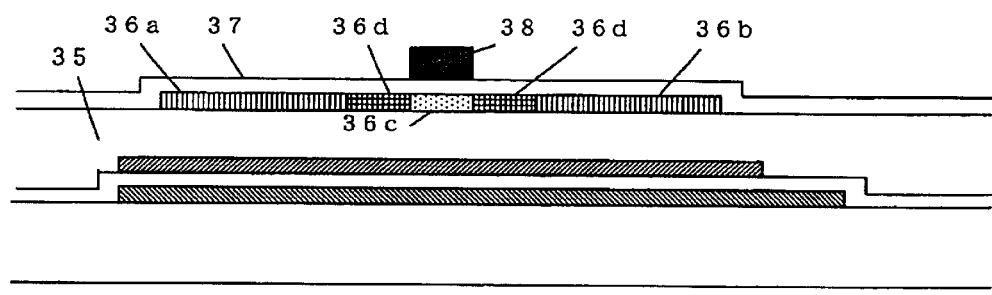

First, as shown in FIG. 9A, the first storage capacitor electrode 32, the storage capacitor dielectric layer 33 and the second storage capacitor electrode 34 are formed in the manner described in Embodiment 1.

As shown in FIG. 9B, using the gate electrode 38 as the mask, phosphorus ions are implanted in the crystalline silicon layer (semiconductor layer) 36 in an amount of about $5 \times 10^{12}$ atoms/cm$^2$, to form the LDD regions 36d. Subsequently, after covering the gate electrode 38 and part of the LDD regions 36d by a general photolithographic process, phosphorus ions are again implanted in the crystalline silicon layer 36 in an amount of about $2 \times 10^{15}$ atoms/cm$^2$, to form the source region 36a and the drain region 36b. The portion left unimplanted constitutes the channel region 36c.

With the LDD regions 36d formed between the channel region 36c and the source region 36a and between the channel region 36a and the drain regions 36b, OFF current, which is a pixel TFT characteristic, can be reduced, and this permits further improvement of the display quality of the liquid crystal panel.

Figure 9C:
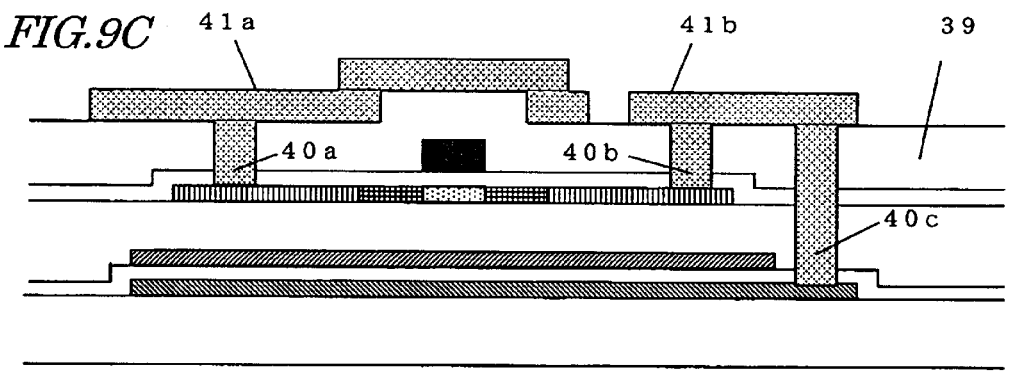
Figure 9D:
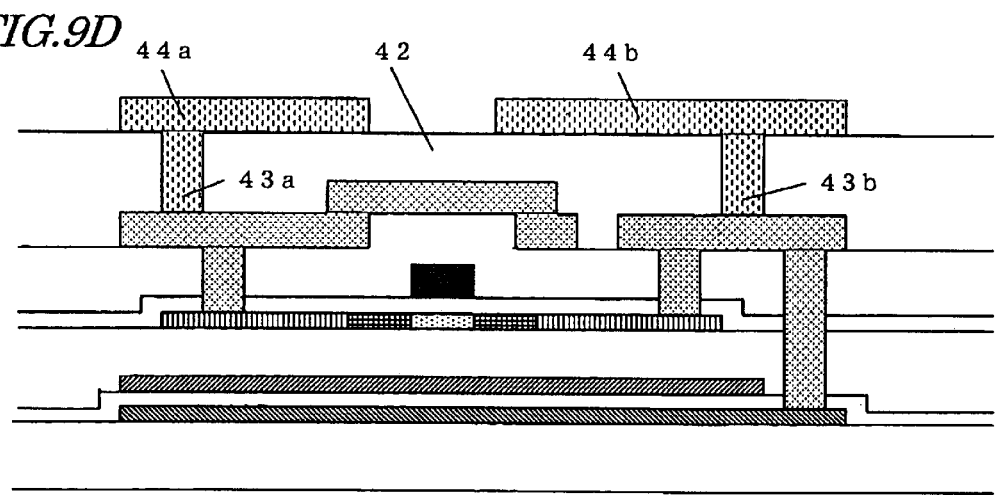

Thereafter, as shown in FIGS. 9C and 9D, the TFT substrate having the TFT portion shown in FIG. 8 is fabricated by following the process steps described in Embodiment 1. In this embodiment, however, the source-side light-shielding portion 41a is formed covering at least the channel region 36c and the LDD regions 36d.

As in Embodiment 1, in the TFT portion in Embodiment 2 configured as described above, the light-shielding layer is placed near the channel region 36c and the LDD regions 36d. This improves the light shielding property against light entering the channel region 36c from the sides, which is conventionally insufficient, and thus improves the display quality.

Moreover, the drain-side light-shielding portion 41b, connected to the drain region 36b, is also connected to the first storage capacitor electrode 32 via the storage capacitor contact hole 40c. Therefore, the connection with the drain region 36b of the TFT can be attained without the necessity of providing a too deep contact hole for connection with the storage capacitor placed below the TFT. Thus, a sufficient margin can be given for possible inprocess failure due to overetching during dry etching, such as penetration and contact cut at a step. This contributes to improvement of the productivity and yield of the TFT substrates.

Known materials and film formation methods may be adopted as the materials, thicknesses and formation methods of the components of the TFT portion shown in FIG. 8. The sizes such as the film thicknesses may be appropriately changed depending on the use and the like of the TFT substrate.

Alterations to the TFT substrate of Embodiment 2 will be described with reference to FIGS. 10 to 13. In these drawings, substantially the same components as those in FIGS. 8 and 9A to 9D are denoted by the same reference numerals, and the description thereof is omitted.

Figure 10:
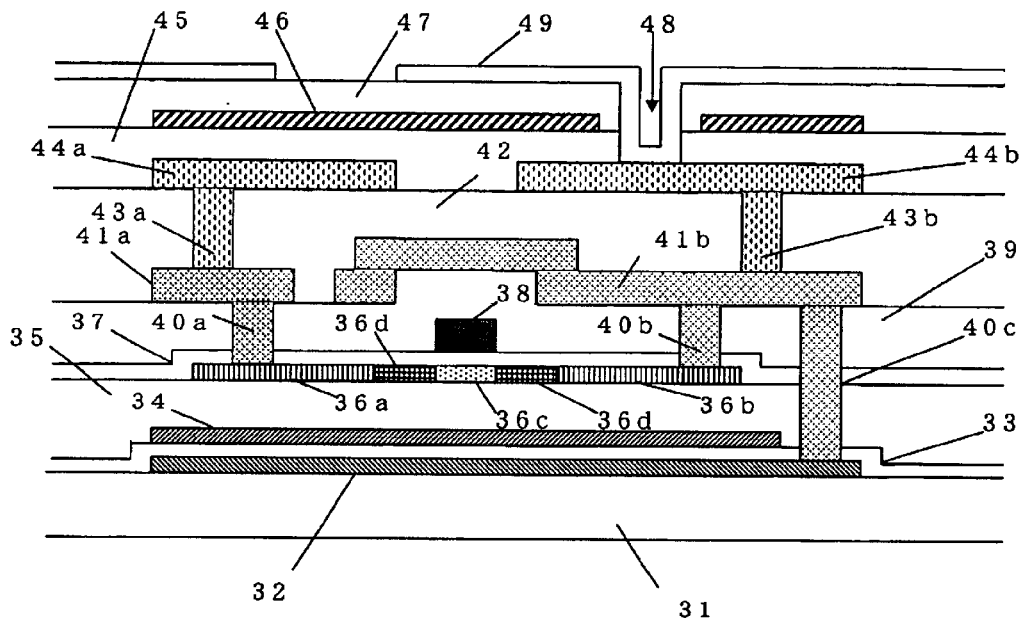
FIG. 10 is a diagrammatic cross-sectional view of the structure of a TFT portion of an alteration to the TFT substrate of Embodiment 2 according to the present invention.

FIG. 10 diagrammatically shows a cross-sectional structure of a TFT portion of an alteration to the TFT substrate of Embodiment 2. This TFT portion is different from the TFT portion shown in FIG. 8 in that the drain-side light-shielding portion 41b of the first light-shielding layer is formed to cover the channel region 36a and the LDD regions 36d.

Figure 11:
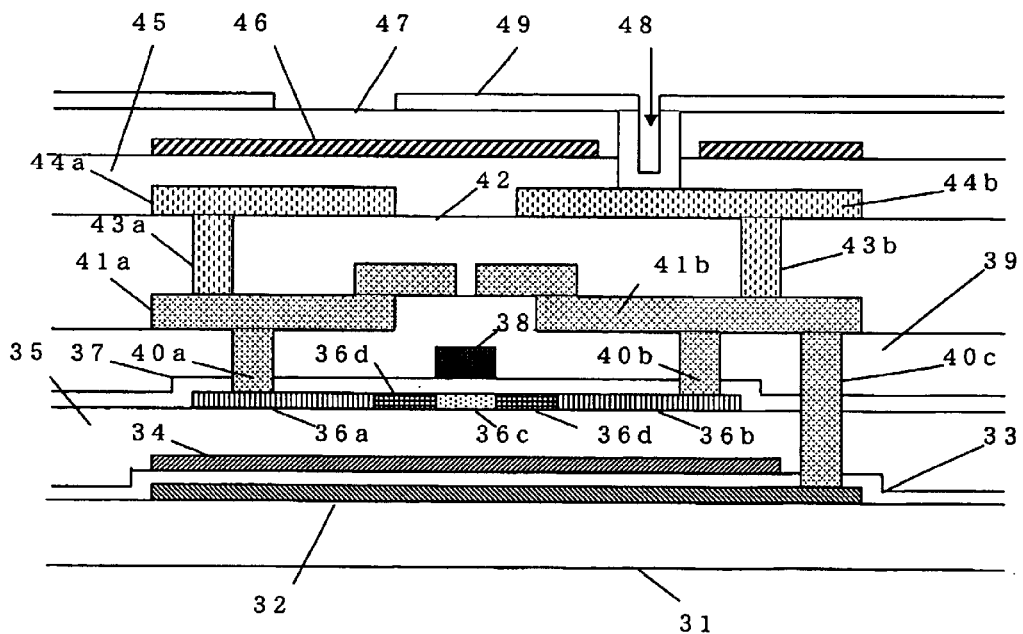
FIG. 11 is a diagrammatic cross-sectional view of the structure of a TFT portion of another alteration to the TFT substrate of Embodiment 2 according to the present invention.

FIG. 11 diagrammatically shows a cross-sectional structure of a TFT portion of another alteration to the TFT substrate of Embodiment 2. This TFT portion is different from the TFT portion shown in FIG. 8 in that the source-side light-shielding portion 41a and the drain-side light-shielding portion 41b of the first light-shielding layer are separated from each other at a position above the gate electrode 38.

Each of the source-side light-shielding portion 41a and the drain-side light-shielding portion 41b partially covers the channel region 36c and the LDD regions 36d. Light passing through the gap between the source-side and drain-side light-shielding portions 41a and 41b will not be incident on the channel region 36c or the LDD regions 36d because the gap is located above the gate electrode 38.

Figure 12:
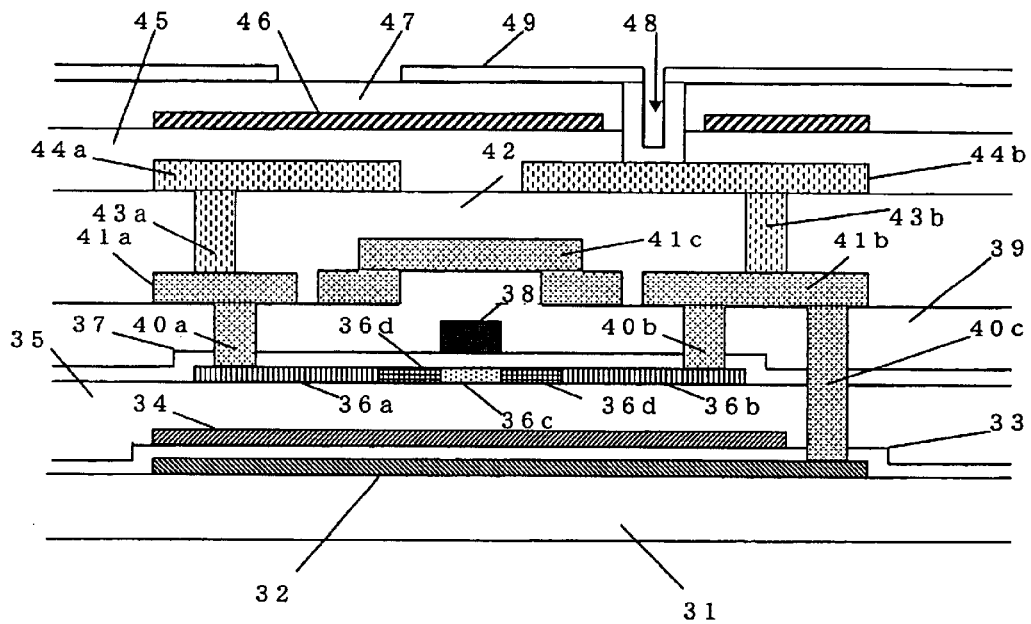
FIG. 12 is a diagrammatic cross-sectional view of the structure of a TFT portion of yet another alteration to the TFT substrate of Embodiment 2 according to the present invention.

FIG. 12 diagrammatically shows a cross-sectional structure of a TFT portion of yet another alteration to t h e TFT substrate of Embodiment 2. The first light-shielding layer further has a middle light-shielding portion 41c with no electrical connection with the source-side light-shielding portion 41a or the drain-side light-shielding portion 41b, placed to cover the channel region 36c and the LDD regions 36d. Since the middle light-shielding portion 41c is electrically independent of the source electrode 44a and the drain electrode 44b, a constant voltage may be applied to this portion from outside the pixel region, for example. By holding the middle light-shielding portion 41c, which is formed above the channel region 36c (gate electrode 38), at a constant voltage, the voltage (potential) at the semiconductor layer (polysilicon layer) can be stabilized. This advantageously stabilizes the TFT characteristics. In addition, the current flowing in the LDD regions may be increased with the potential of the middle light-shielding portion 41c, to thereby increase ON current of the TFT.

Figure 13:
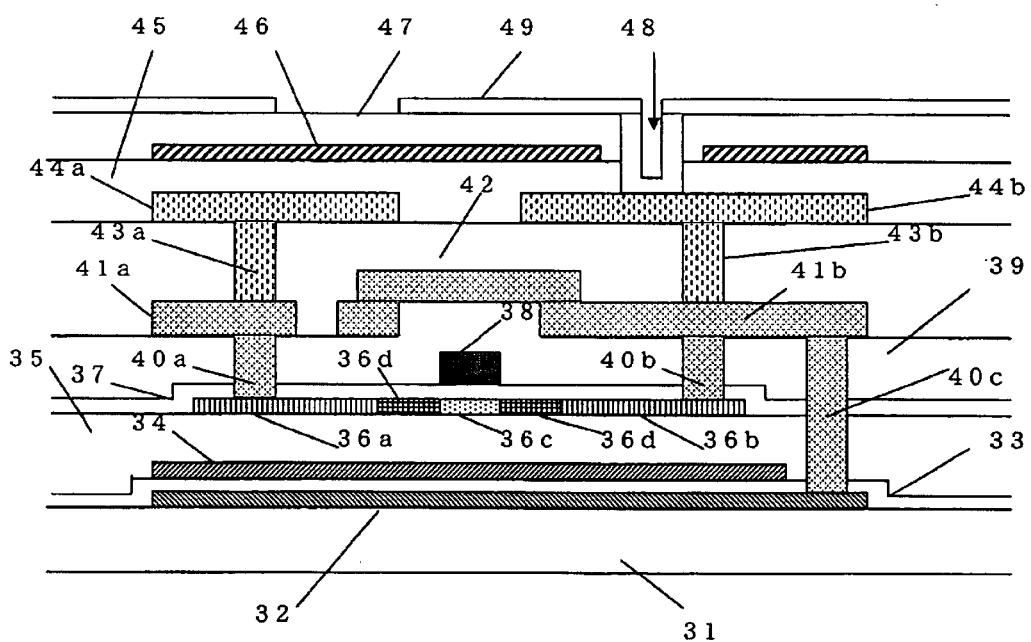
FIG. 13 is a diagrammatic cross-sectional view of the structure of a TFT portion of yet another alteration to the TFT substrate of Embodiment 2 according to the present invention.

FIG. 13 diagrammatically shows a cross-sectional structure of a TFT portion of yet another alteration to the TFT substrate of Embodiment 2. In this TFT portion, the second source contact hole 43a and the second drain contact hole 43b are formed at positions in line with the first source contact hole 40a and the first drain contact hole 40b, respectively. That is, these holes are formed to coincide with each other when viewed in the direction normal to the substrate.

By placing the contact holes as described above, the regions necessary for formation of the contact holes can be reduced, and thus the pixel aperture ratio can be enhanced.

Although the above placement of the contact holes in line with each other was applied to the configuration shown in FIG. 13, the same effect will be obtained when this placement is applied to any of the configurations shown in FIG. 10 to 12.

According to the present invention, in an active matrix display device having a storage capacitor for each pixel, and in an active matrix substrate used for the active matrix display device, light is effectively blocked from entering a semiconductor layer while reduction in aperture ratio is suppressed.

According to the present invention, an active matrix substrate with high aperture ratio, high definition and excellent light resistance can be fabricated with high productivity. Such an active matrix substrate can be suitably applied to a projection display device, in particular.

While the present invention has been described in preferred embodiments, it will be apparent to those skilled in the art that the disclosed invention may be modified in numerous ways and may assume many embodiments other than that specifically set out and described above. Accordingly, it is intended by the appended claims to cover all modifications of the invention that fall within the true spirit and scope of the invention.

What is claimed is:

1. An active matrix substrate including a plurality of semiconductor elements formed on a board, a semiconductor element portion of the active matrix substrate, in which the plurality of semiconductor elements are formed, comprising:

a storage capacitor formed on the board;

a first insulating layer formed on the storage capacitor;

a semiconductor layer formed above the storage capacitor via the first insulating layer:

a gate insulating layer formed on the semiconductor layer;

a gate electrode layer including a gate electrode formed above the semiconductor layer via the gate insulating layer;

a second insulating layer covering the gate electrode layer and the semiconductor layer;

a first light-shielding layer formed above the semiconductor layer via the second insulating layer to cover at least a channel region of the semiconductor layer;

a third insulating layer formed on the first light-shielding layer;

a source electrode layer including a source electrode and a drain electrode formed on the third insulating layer;

a fourth insulating layer formed on the source electrode layer; and a pixel electrode formed on the fourth insulating layer and electrically connected to the drain electrode, wherein the first light-shielding layer is conductive and has a drain-side light-shielding portion electrically connected to one of a pair of electrodes of the storage capacitor and also electrically connected to the drain electrode.

2. The active matrix substrate of claim 1, wherein the first light-shielding layer further has a source-side light-shielding portion electrically connected to the source electrode.

3. The active matrix substrate of claim 1, wherein the first light-shielding layer further has a middle light-shielding portion having no electrical connection with the source electrode or the drain electrode, and the middle light-shielding portion is placed above the channel region.

4. The active matrix substrate of claim 3, wherein the middle light-shielding portion is held at a constant voltage.

5. The active matrix substrate of claim 1, wherein the first light-shielding layer further has a source-side light-shielding portion connected to the source electrode, the first and second insulating layers have a contact hole for connecting the first light-shielding layer and the one of the electrodes of the storage capacitor, and the second insulating layer further has a first contact hole for connecting the drain-side light-shielding portion and the drain region of the semiconductor layer and a second contact hole for connecting the source-side light-shielding portion and the source region of the semiconductor layer, the third insulating layer has a third contact hole for connecting the drain electrode and the drain-side light-shielding portion and a fourth contact hole for connecting the source electrode and the source-side light-shielding portion, and the first contact hole and the third contact hole are placed to be in line with each other, and the second contact hole and the fourth contact hole are placed to be in line with each other.

6. The active matrix substrate of claim 1, wherein the semiconductor layer has LDD regions on both sides of the channel region, and the first light-shielding layer is placed above at least the channel region and the LDD regions.

7. The active matrix substrate of claim 6, wherein the first light-shielding layer further has a middle light-shielding portion having no electrical connection with the source electrode or the drain electrode, and the middle light-shielding portion is placed above the channel region and the LDD regions.

8. The active matrix substrate of claim 7, wherein the middle light-shielding portion is held at a constant potential.

9. The active matrix substrate of claim 1, further comprising between the source electrode layer and the fourth insulating layer:

a fifth insulating layer covering the source electrode layer; and a second light-shielding layer formed above at least a gap between the source electrode and the drain electrode via the fifth insulating layer.

10. A display device having an active matrix substrate and a display medium layer, wherein the active matrix substrate includes a plurality of semiconductor elements formed on a board, a semiconductor element portion of the active matrix substrate, in which the plurality of semiconductor elements are formed, comprising:

a storage capacitor formed on the board;

a first insulating layer formed on the storage capacitor;

a semiconductor layer formed above the storage capacitor via the first insulating layer:

a gate insulating layer formed on the semiconductor layer;

a gate electrode layer including a gate electrode formed above the semiconductor layer via the gate insulating layer;

a second insulating layer covering the gate electrode layer and the semiconductor layer;

a first light-shielding layer formed above the semiconductor layer via the second insulating layer to cover at least a channel region of the semiconductor layer;

a third insulating layer formed on the first light-shielding layer;

a source electrode layer including a source electrode and a drain electrode formed on the third insulating layer;

a fourth insulating layer formed on the source electrode layer; and a pixel electrode formed on the fourth insulating layer and electrically connected to the drain electrode, wherein the first light-shielding layer is conductive and has a drain-side light-shielding portion electrically connected to one of a pair of electrodes of the storage capacitor and also electrically connected to the drain electrode.

* * * * *